US007324366B2

(12) United States Patent
Bednorz et al.

(10) Patent No.: US 7,324,366 B2
(45) Date of Patent: Jan. 29, 2008

(54) NON-VOLATILE MEMORY ARCHITECTURE EMPLOYING BIPOLAR PROGRAMMABLE RESISTANCE STORAGE ELEMENTS

(75) Inventors: Johannes Georg Bednorz, Wolfhausen (CH); Chung Hon Lam, Peekskill, NY (US); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/409,440

(22) Filed: Apr. 21, 2006

(65) Prior Publication Data
US 2007/0247893 A1    Oct. 25, 2007

(51) Int. Cl.
G11C 11/00    (2006.01)
(52) U.S. Cl. ............... 365/148; 365/100; 365/177
(58) Field of Classification Search ............... 365/148, 365/100, 103, 104, 177
See application file for complete search history.

(56) References Cited

U.S. PATENT DOCUMENTS

| 5,936,880 A * | 8/1999 | Payne ................... 365/148 |
|---|---|---|
| 6,204,139 B1 | 3/2001 | Liu et al. |
| 6,815,744 B1 | 11/2004 | Beck et al. |
| 6,882,578 B2 * | 4/2005 | Moore et al. ........... 365/189.01 |
| 7,061,800 B2 * | 6/2006 | Ooishi .................. 365/185.09 |
| 2005/0212022 A1 * | 9/2005 | Greer et al. ............ 257/296 |
| 2006/0110878 A1 * | 5/2006 | Lung et al. ............. 438/253 |

* cited by examiner

Primary Examiner—Gene N. Auduong
(74) Attorney, Agent, or Firm—Ido Tuchman; Ryan, Mason & Lewis, LLP

(57) ABSTRACT

A nonvolatile memory array includes a plurality of word lines, a plurality of bit lines, a plurality of source lines, and a plurality of nonvolatile memory cells. Each of at least a subset of the plurality of memory cells has a first terminal connected to one of the plurality of word lines, a second terminal connected to one of the plurality of bit lines, and a third terminal connected to one of the plurality of source lines. At least one of the memory cells includes a bipolar programmable storage element operative to store a logic state of the memory cell, a first terminal of the bipolar programmable storage element connecting to one of a corresponding first one of the bit lines and a corresponding first one of the source lines, and a metal-oxide-semiconductor device including first and second source/drains and a gate. The first source/drain is connected to a second terminal of the bipolar programmable storage element, the second source/drain is adapted for connection to a corresponding second one of the bit lines, and the gate is adapted for connection to a corresponding one of the word lines. For at least a subset of the plurality of memory cells, each pair of adjacent memory cells along a given word line shares either the same bit line or the same source line.

20 Claims, 6 Drawing Sheets

| BIAS = V | S1 | B1 | S2 | B2 | S3 |
|---|---|---|---|---|---|
|  | 0.5 | 0.5 | 0 | 0.5 | 0.5 |
| W4 | 0 | m4, 1 | m4, 2 | m4, 3 | m4, 4 |
| W3 | 0 | m3, 1 | m3, 2 | m3, 3 | m3, 4 |
| W2 | 1 | m2, 1 | m2, 2 | m2, 3 | m2, 4 |
| W1 | 0 | m1, 1 | m1, 2 | m1, 3 | m1, 4 |

NON-VOLATILE MEMORY ARCHITECTURE EMPLOYING BIPOLAR PROGRAMMABLE RESISTANCE STORAGE ELEMENTS

FIELD OF THE INVENTION

The present invention relates generally to memory devices, and more particularly relates to a nonvolatile memory architecture employing a bipolar programmable resistance element.

BACKGROUND OF THE INVENTION

Storage elements employing bipolar programmable resistance materials offer a potential replacement for current non-volatile memory, including, but not limited to, flash memory, one-transistor one-capacitor (1T1C) dynamic random access memory (DRAM) and static random access memory (SRAM). Memory devices employing bipolar programmable resistance storage elements typically rely on a reversal of the polarity of a voltage applied across the storage element in each of the devices in order to write the respective logic states of the memory devices. These nonvolatile bipolar programmable resistance storage elements, which include materials such as "spin-switched" or "spin momentum transfer" magnetic materials and/or programmable resistance transition-metal oxides, can be programmed at low voltages (e.g., less than about 1.5 volts (V)) and can achieve a high performance comparable to DRAM or SRAM and superior to flash memory.

Due to the bipolar nature of the programmable resistance storage element, in a one-transistor one programmable resistor (1T1R) memory cell configuration, each memory cell will typically require an intervening erase operation, which involves the use of negative voltages, before a write operation is performed. This intervening erase operation undesirably increases the complexity of circuits that are peripheral to the memory device in order to support the generation of the negative voltages employed, and is therefore an impediment to achieving higher performance in the memory device. Although, a direct write without the intervening erase operation can be achieved by providing dual select lines in a bit direction, this approach would significantly increase a size of the memory cell in order to accommodate the additional select lines. Consequently, the cost of the memory cell, which is directly proportional to memory cell size, would increase accordingly. Thus, it is of utmost importance to minimize the size and complexity of the memory cell.

Accordingly, there exists a need for a nonvolatile memory architecture employing bipolar programmable resistance storage elements that does not suffer from one or more of the problems exhibited by conventional memory devices having bipolar programmable storage elements.

SUMMARY OF THE INVENTION

The present invention meets the above-noted need by providing, in an illustrative embodiment, a nonvolatile memory array employing bipolar programmable resistance elements which is configured to enable direct write operation and thereby eliminate the need for an intervening erase operation, without increasing a complexity of peripheral support circuits associated with the memory array. A device utilizing this memory array may be fabricated in a manner which minimizes a footprint of the device, so as to achieve an efficient memory array layout.

In accordance with one aspect of the invention, a nonvolatile memory array includes a plurality of word lines, a plurality of bit lines, a plurality of source lines, and a plurality of nonvolatile memory cells. Each of at least a subset of the plurality of memory cells has a first terminal connected to one of the plurality of word lines, a second terminal connected to one of the plurality of bit lines, and a third terminal connected to one of the plurality of source lines. At least one of the memory cells includes a bipolar programmable storage element operative to store a logic state of the memory cell, a first terminal of the bipolar programmable storage element connecting to one of a corresponding first one of the bit lines and a corresponding first one of the source lines, and a metal-oxide-semiconductor device including first and second source/drains and a gate. The first source/drain is connected to a second terminal of the bipolar programmable storage element, the second source/drain is adapted for connection to a corresponding second one of the bit lines, and the gate is adapted for connection to a corresponding one of the word lines. For at least a subset of the plurality of memory cells, each pair of adjacent memory cells along a given word line shares either the same bit line or the same source line.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative nonvolatile memory cell and a memory array employing a plurality of such nonvolatile memory cells. It should be understood, however, that the present invention is not limited to these or any other particular circuit arrangements. Rather, the invention is more generally applicable to techniques for enhancing a programming performance of a nonvolatile memory array employing memory cells comprising bipolar programmable resistance elements. Although implementations of the present invention are described herein with specific reference to a metal-oxide-semiconductor (MOS) field-effect transistor (FET) device, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1A:
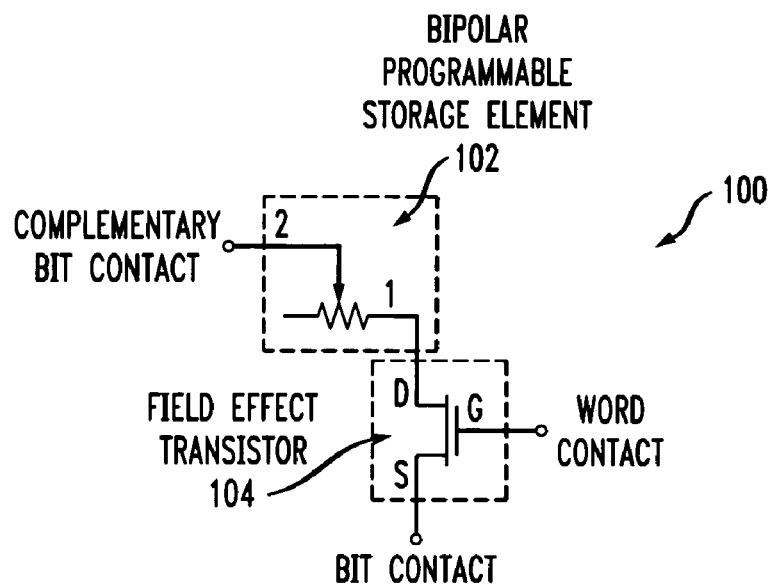
FIG. 1A is a schematic diagram depicting an exemplary nonvolatile memory cell including a bipolar programmable resistance storage element, formed in accordance with one embodiment of the present invention.

FIG. 1A is a schematic diagram depicting an exemplary nonvolatile memory cell 100 suitable for use with the present invention. The illustrative memory cell 100 includes a two-terminal bipolar programmable storage element 102 connected in series with a FET device 104 having a gate (G), a source (S) and a drain (D). Specifically, a first terminal (1) of the programmable storage element 102 is connected to the drain of the FET device 104. The source of the FET device 104 preferably forms a first bit contact of the memory cell 100 and a second terminal (2) of the programmable storage element 102 forms a second bit contact, which may be a complementary bit contact, of the memory cell. The term "contact" as used herein is intended to refer to essentially any means for providing electrical connection to a device, node, or junction of two or more conductors and/or semiconductors, etc., and may include terminals, pins, etc., as will be known by those skilled in the art. The gate of the FET device 104 forms a word contact, which functions as a select gate of the memory cell 100. The word contact may be coupled to a corresponding word line in a memory array (not shown) employing a plurality of such memory cells. Likewise, the bit contacts may be coupled to a corresponding bit line/source line pair in the memory array. While preferably running in the same direction, the bit line and source line for a given memory cell may be formed in different metal levels (e.g., metal 1 and metal 2) in order to reduce the size of the memory cell 100.

It is to be appreciated that, because an MOS device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain. Likewise, the designations of the bit contact and complementary bit contact depicted in FIG. 1A may be reversed, with essentially no effect on the operation of the memory cell 100.

The bipolar programmable storage element 102 is represented in the figure by a programmable resistor having a variable resistance element associated therewith. The resistance of the bipolar programmable storage element 102 can be programmed into one of at least two distinct resistances in a write operation of the memory cell 100. Examples of bipolar programmable storage elements include, but are not limited to, materials such as "spin-switched" or "spin momentum transfer" magnetic materials and programmable resistance transition-metal oxides, as previously stated.

In a "spin-switched" or "spin momentum transfer" memory device, a logic state of a magnetic tunnel junction (MTJ) in the device is switched or written by passing current through the MTJ. A standard MTJ comprises a storage (free) layer and a reference layer separated by a tunnel barrier. A magnetization of the storage layer may be oriented parallel or anti-parallel to the reference layer, representing either a logic "0" or a "1." When writing the MTJ, tunneling carriers in the MTJ exert a "magnetic torque" upon the storage layer, causing it to switch. The polarity of a write current used to write the MTJ primarily determines the state written into the MTJ. Similarly, when reading the logic state of the MTJ, a read current is passed through the MTJ to determine its effective resistance, and thereby determine its corresponding state. The write current must be sufficiently larger than the read current such that the read current does not unintentionally disturb the state of the cell.

Figure 2:
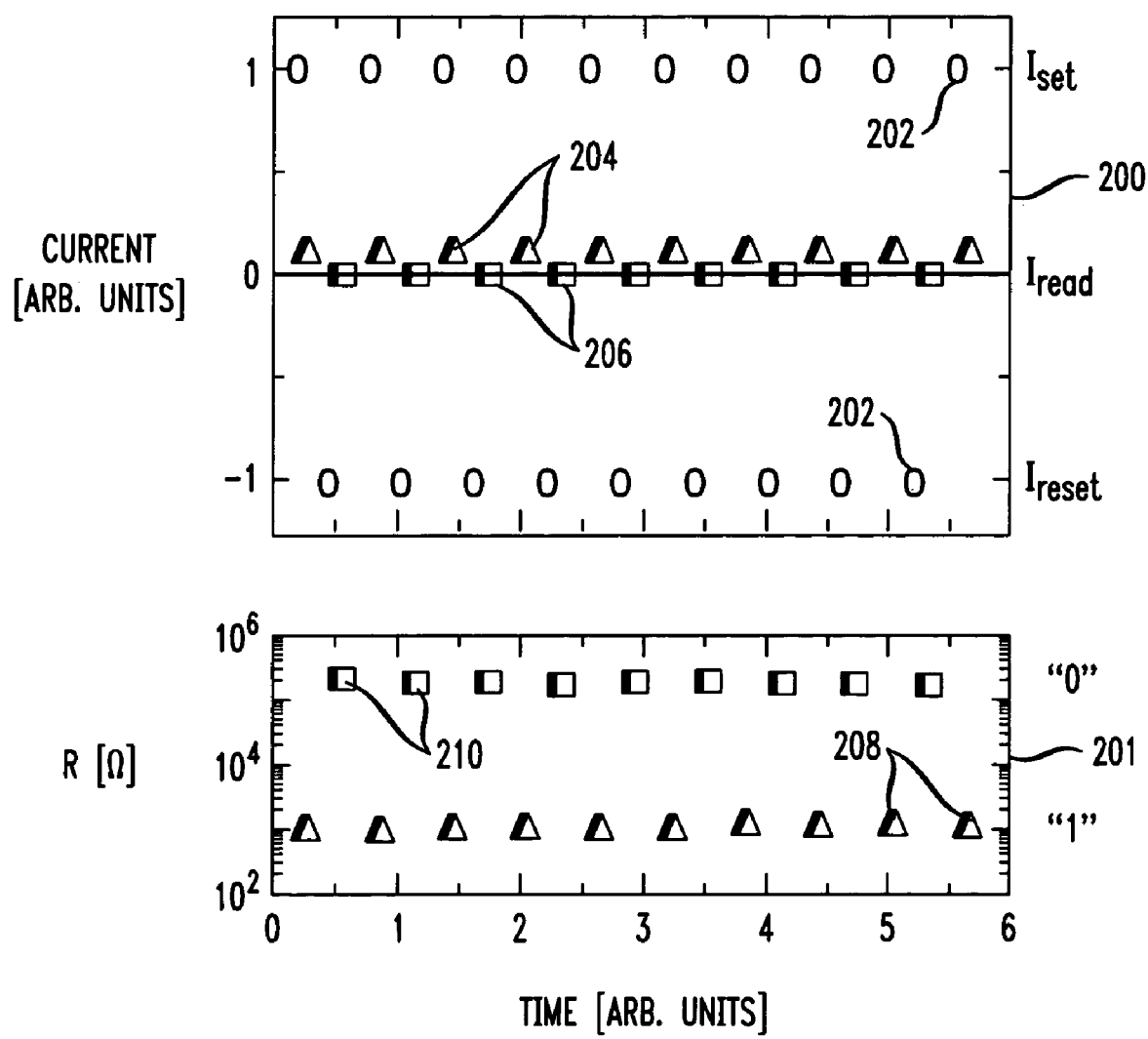
FIG. 2 is a graphical illustration depicting exemplary bipolar programmable resistance characteristics of a transition-metal oxide storage element.

In a bipolar programmable memory cell comprising a transition-metal oxide (TMO) material as the storage element, a logic state of the TMO storage element is programmed or written by passing a current, $I_{set}$ or $I_{reset}$, through the TMO storage element. This is illustrated in FIG. 2, which depicts an exemplary bipolar programmable resistance of a TMO material (graph 201) and corresponding programming/read current (graph 200). The current $I_{set}$, which is shown as having a magnitude of 1 arbitrary unit and a positive sign, may be used to write a logic "1" into the TMO storage element. Likewise, the current $I_{reset}$, which is shown as having a magnitude of 1 arbitrary unit and a negative sign, may be used to write a logic "0" into the TMO storage element. A read current, $I_{read}$, may be used to read the logic state of the TMO storage element. In graph 200, circles 202 represent programming current, triangles 204 represent a read current for a logic "1" state, and squares 206 represent a read current for a logic "0" state. In graph 201, triangles 208 represent a resistance of the TMO storage element while in a logic "1" state, and squares 210 represent the resistance of the TMO storage element while in a logic "0" state.

For programming, a bias voltage (e.g., about 1.5V) is preferably applied to the TMO storage element for a duration longer than a given time (e.g., about 100 nanoseconds (ns)). A polarity of the bias voltage used to write the TMO storage element primarily determines the logic state written into the memory cell. The resistance of the storage element can be varied, for example, from about one hundred kilo ohms (KΩ) to about one KΩ, representing a logic "0" and a logic "1", respectively, as shown in FIG. 2. Similarly, when reading the logic state of the TMO storage element, a read current (e.g., $I_{read}$) is passed through the TMO storage element to determine its effective resistance, and thereby determine its corresponding state. The read current should be sufficiently smaller than the write current, such that the read current does not unintentionally disturb the state of the memory cell. As shown in FIG. 2, the current for reading a logic "0" will be slightly smaller compared to the current for reading a logic "1," due primarily to the difference in resistance of the TMO storage element in the two logic states.

A TMO material suitable for use as bipolar programmable storage element 102 in the present invention includes, but is not limited to, chromium-doped strontium titanium oxide (Cr-doped $SrTiO_3$). Further suitable results have been achieved, in particular, with strontium titanium oxide ($SrTiO_3$), strontium barium titanium oxide ($(Sr, Ba)TiO_3$), praseodymium calcium manganese oxide ($(Pr, Ca)MnO_3$), strontium zirconium oxide ($SrZrO_3$), nickel oxide (NiO), and other transition-metal oxides. The transition metal oxides can be doped preferentially with chromium, manganese, or vanadium. Further, the materials described in U.S. Pat. No. 6,815,744 issued to Black et al. on Nov. 9, 2004 and U.S. Pat. No. 6,204,139 issued to Liu et al. on Mar. 20, 2001, incorporated herein by reference, are advantageously suitable for use in implementing storage element 102.

During a write cycle, a word line coupled to the word contact of the memory cell 100 is preferably driven high, thereby turning on the FET 104. Depending on the logic state to be written into the cell, a bit contact of the cell is preferably driven high and the other bit contact of the cell, being complementary, is driven low, thereby causing a current to flow through the bipolar programmable storage element 102 from the high bit line to the low source line. When writing the state which requires current to flow from the FET 104 to the storage element 102, an overdrive (e.g., Vgs-Vt, where Vgs is a gate-to-source voltage of the FET and Vt is a threshold voltage of the FET) will be reduced, thus limiting the current. Boosting the selected word line to a voltage potential above a positive voltage supply, which may be Vdd, of the memory cell, as is often done in a DRAM environment, can provide additional overdrive (and accompanying current) to help alleviate this problem. During a read cycle, the word line is driven high, thereby turning on the FET 104, and the resistance of the programmable storage element is measured by application of appropriate bias voltages to the two bit contacts of the memory cell 100. Concurrently, one of the bit contacts, preferably the bit contact connecting to the FET 104, is held at ground potential while the other bit contact is forced to a desired read voltage, Vread. The read voltage is preferably lower than a write voltage used to write the logical state of the memory cell. The current flowing through this second bit contact is then sensed to determine the state of the memory cell 100.

In an alternative embodiment, which may be beneficial when the required write voltage and current are sufficiently small, either a bit line or a source line of a bit line/source line pair connecting to the two bit contacts of a given memory cell can be replaced by a new connection to a mid-level voltage source, Vmid. In this instance, during a write cycle, the remaining bit line or source line is forced high or low depending on the state to be written. During a read cycle, the new connection is forced to the mid-level voltage plus or minus the desired read voltage. As before, the word line is driven high in both the read and write cycles. This alternative embodiment has the potential of achieving a smaller memory cell size due to the elimination of one line of the bit line/source line pair.

Various design considerations may go into the selection of which bit line/source line to eliminate (e.g., the bit line/source line connected to the FET 104, or the bit line/source line connected to the bipolar programmable storage element 102) and the choice of reading the cell at the mid-level voltage plus the read voltage (Vmid+Vread) or reading at the mid-level voltage minus the read voltage (Vmid−Vread). Moreover, the ideal choice for the mid-level voltage may not necessarily be Vdd/2, in order to compensate for other asymmetries which may exist in the memory cell 100.

Figure 1B:
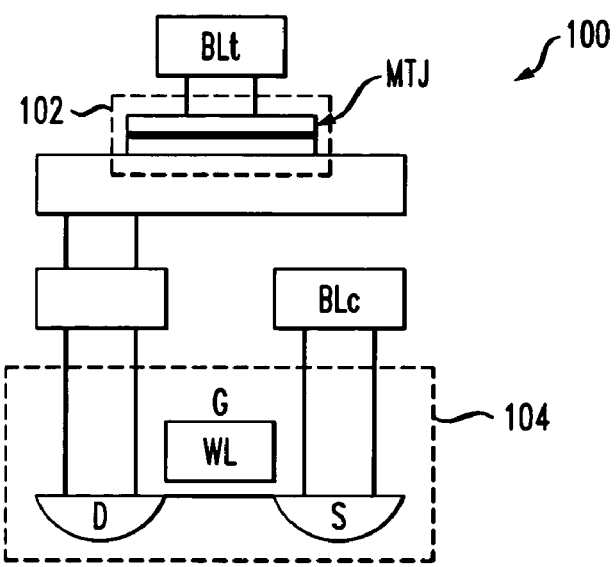
FIG. 1B is a cross-sectional view illustrating an exemplary semiconductor layout of the memory cell shown in FIG. 1A, in accordance with the present invention.

FIG. 1B is a cross-sectional view depicting an exemplary semiconductor layout of at least a portion of the memory cell 100 shown in FIG. 1A. As apparent from the figure, the bipolar programmable storage element 102 preferably comprises an MTJ and/or programmable resistance TMO that is formed substantially directly above the FET device 104, so as to minimize the semiconductor area (footprint) consumed by the memory cell 100. It is to be understood that the present invention is not limited to the specific semiconductor layout shown.

Figure 3A:
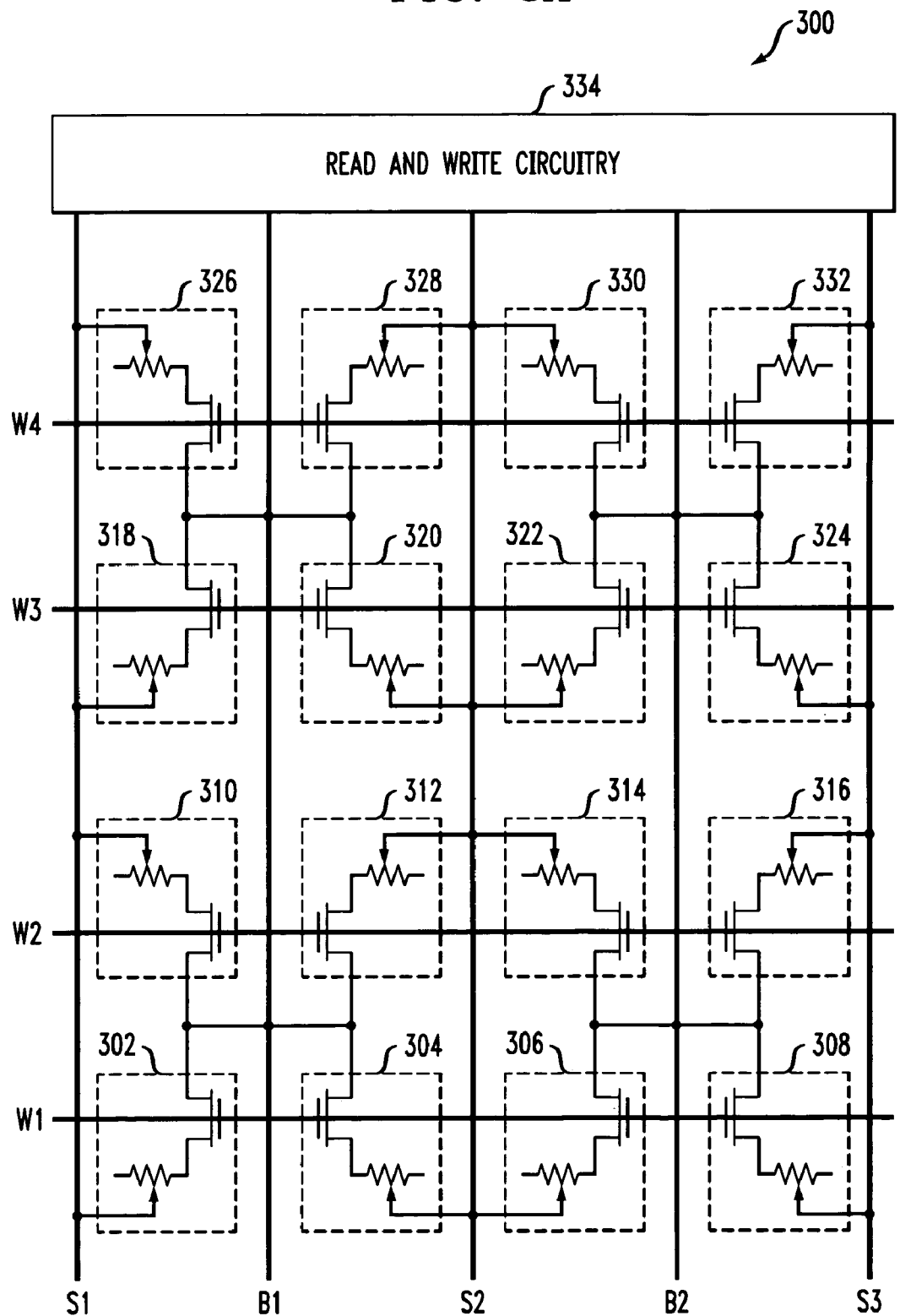
FIG. 3A is a schematic diagram depicting an exemplary shared word line memory array including a plurality of the memory cells shown in FIG. 1A, in accordance with another embodiment of the present invention.

In a memory array comprising a plurality of memory cells of the type shown in FIG. 1A, the word contacts of the respective memory cells are preferably connected to corresponding word lines in the memory array, and the respective bit and complementary bit contacts are preferably connected to corresponding bit lines and source lines in the memory array. FIG. 3A is a schematic diagram depicting at least a portion of an exemplary nonvolatile memory array 300, formed in accordance with one embodiment of the invention. The memory array 300 preferably employs a unique shared word line architecture which will be described in further detail below.

The memory array 300 includes a plurality of memory cells 302, 304, 306, 308, 310, 312, 314, 316, 318, 320, 322, 324, 326, 328, 330 and 332, operatively coupled to corresponding word lines W1, W2, W3 and W4, corresponding bit lines B1 and B2, and corresponding source lines S1, S2 and S3. Specifically, for each memory cell in at least a subset of the plurality of memory cells, a first terminal (e.g., a word contact) of the memory cell is connected to a corresponding one of the word lines, a second terminal (e.g., a first bit contact) of the memory cell is connected to a corresponding one of the bit lines, and a third terminal (e.g., a second bit contact) of the memory cell is connected to a corresponding one of the source lines. Thus, for a given memory cell in at least the subset of memory cells, the gate of the FET device in the given memory cell is coupled to a corresponding word line and, when the FET device is turned on (e.g., by application of an appropriate voltage to the FET device), the bipolar programmable storage element in the memory cell is coupled between a corresponding bit line and a corresponding source line for selectively reading and/or writing the memory cell.

In this illustrative embodiment, the word lines are arranged substantially parallel relative to one another. Likewise, the bit lines and source lines are arranged substantially parallel relative to one another. The bit lines and source lines are preferably arranged in an alternating manner, whereby adjacent bit lines are separated by a source line and adjacent source lines are separated by a bit line. Furthermore, the word lines are preferably oriented substantially orthogonal to the bit lines and source lines. It is to be understood, however, that the invention is not limited to this particular configuration of the word lines, bit lines and/or source lines. For example, although not shown, the word lines may be arranged diagonally with respect to the bit lines and source lines.

Figure 3B:
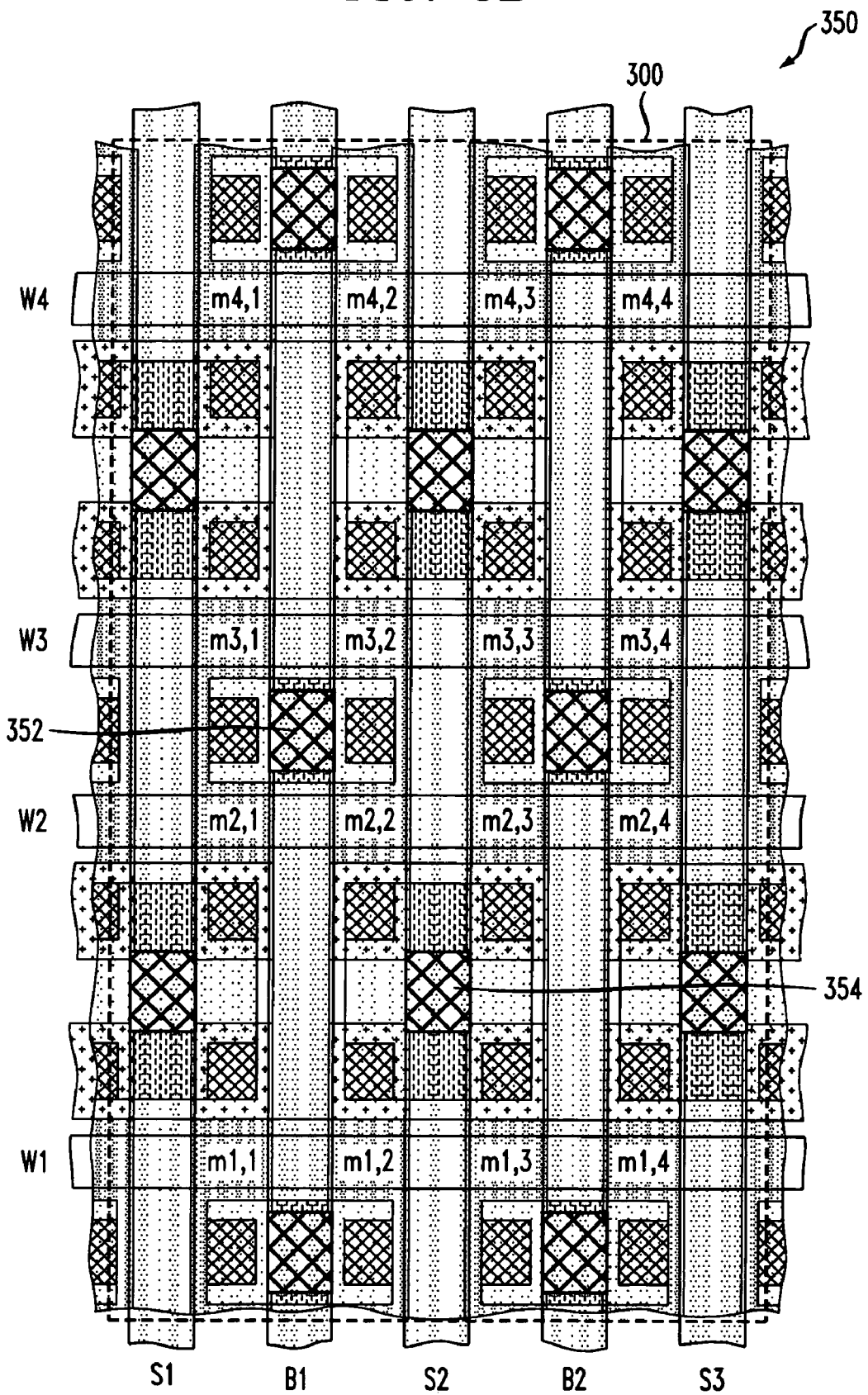
FIG. 3B is a top plan view illustrating an exemplary semiconductor layout of the memory array shown in FIG. 3A, in accordance with the present invention.

FIG. 3B is a top plan view depicting an exemplary semiconductor layout 350 of the memory array 300 shown in FIG. 3A, in accordance with an embodiment of the invention. As apparent from the figure, the layout 350 of the memory array 300 can be arranged to provide a substantially minimized memory cell footprint, compared to conventional memory arrays employing nonvolatile memory cells having bipolar programmable storage elements. The footprint of the resulting bipolar programmable memory cell may be similar to that of a DRAM cell array having a folded bit line architecture. In the layout of FIG. 3B, the designation mi,j is used to represent a given memory cell, where i designates a vertical (column) position of the memory cell in the memory array and j designates a horizontal (row) position of the memory cell in the array. For example, memory cell m1,1 in FIG. 3B corresponds to memory cell 302 in FIG. 3A. Likewise, m1,2 corresponds to memory cell 304, m1,3 corresponds to memory cell 306, m1,4 corresponds to memory cell 308, m2,1 corresponds to memory cell 310, m2,2 corresponds to memory cell 312, m2,3 corresponds to memory cell 314, m2,4 corresponds to memory cell 316, m3,1 corresponds to memory cell 318, m3,2 corresponds to memory cell 320, m3,3 corresponds to memory cell 322, m3,4 corresponds to memory cell 324, m4,1 corresponds to memory cell 326, m4,2 corresponds to memory cell 328, m4,3 corresponds to memory cell 330, and m4,4 corresponds to memory cell 332.

With reference to FIGS. 3A and 3B, the bit lines B1 and B2 and the source lines S1, S2 and S3 are arranged such that, for at least a subset of the plurality of memory cells, any two adjacent memory cells coupled to a given word line share either the same bit line or the same source line, preferably in an alternating manner. For instance, for memory cells 310, 312, 314, 316 which are all connected to word line W2, adjacent memory cells 310 and 312 preferably share bit line B1, adjacent memory cells 312 and 314 share source line S2, adjacent memory cells 314 and 316 share bit line B2, memory cell 316 and a next adjacent memory cell (not shown) along word line W2 share source line S3, and so on. Additionally, the subset of memory cells is preferably configured such that four adjacent memory cells corresponding to a pair of adjacent word lines all share either the same bit line or the same source line. For example, adjacent memory cells 302 and 304 connected to word line W1, and adjacent memory cells 310 and 312 connected to word line W2, which is adjacent to word line W1, all share the same bit line B1. Similarly, adjacent memory cells 312 and 314 connected to word line W2, and adjacent memory cells 320 and 322 connected to neighboring word line W3, all share the same source line S2.

In the exemplary memory array 300, each of the bit line contacts, which may be defined as a connection point between a bit line and a corresponding memory cell(s), is shared by four bit contacts from four individual neighboring memory cells. For example, the bit contacts of memory cells m2,1, m2,2, m3,1 and m3,2, are connected by bit line contact 352 on bit line B1, as shown in FIG. 3B. Moreover, each of the source line contacts, which may be defined as a connection point between a source line and a corresponding memory cell(s), is shared by four complementary bit contacts from four neighboring memory cells. For example, complementary bit contacts of memory cells m1,2, m1,3, m2,2 and m2,3, are connected by source line contact 354 on source line S2. In this arrangement, more than one memory cell can be accessed with one active word line by appropriate application of bias voltages to corresponding bit and source lines functioning as true and complementary bit lines, similar to an SRAM.

Memory array 300 further comprises read and write circuitry 334 for selectively accessing one or more of the plurality of memory cells in the memory array. The read and write circuitry 334 preferably includes, for example, sense amplifiers, bit/source line decoder, etc., utilized by the memory array during a read and/or write operation in the memory array. Operation of the read and write circuitry 334 for selectively reading or writing a given memory cell(s) will be discussed herein below with reference to FIGS. 4 and 5. It is to be appreciated that other circuitry, such as, for example, word line decoding circuitry, may not be depicted in memory array 300 for ease of explanation. This does not imply, however, that such circuitry is omitted in the actual memory array implementation.

Figure 4:
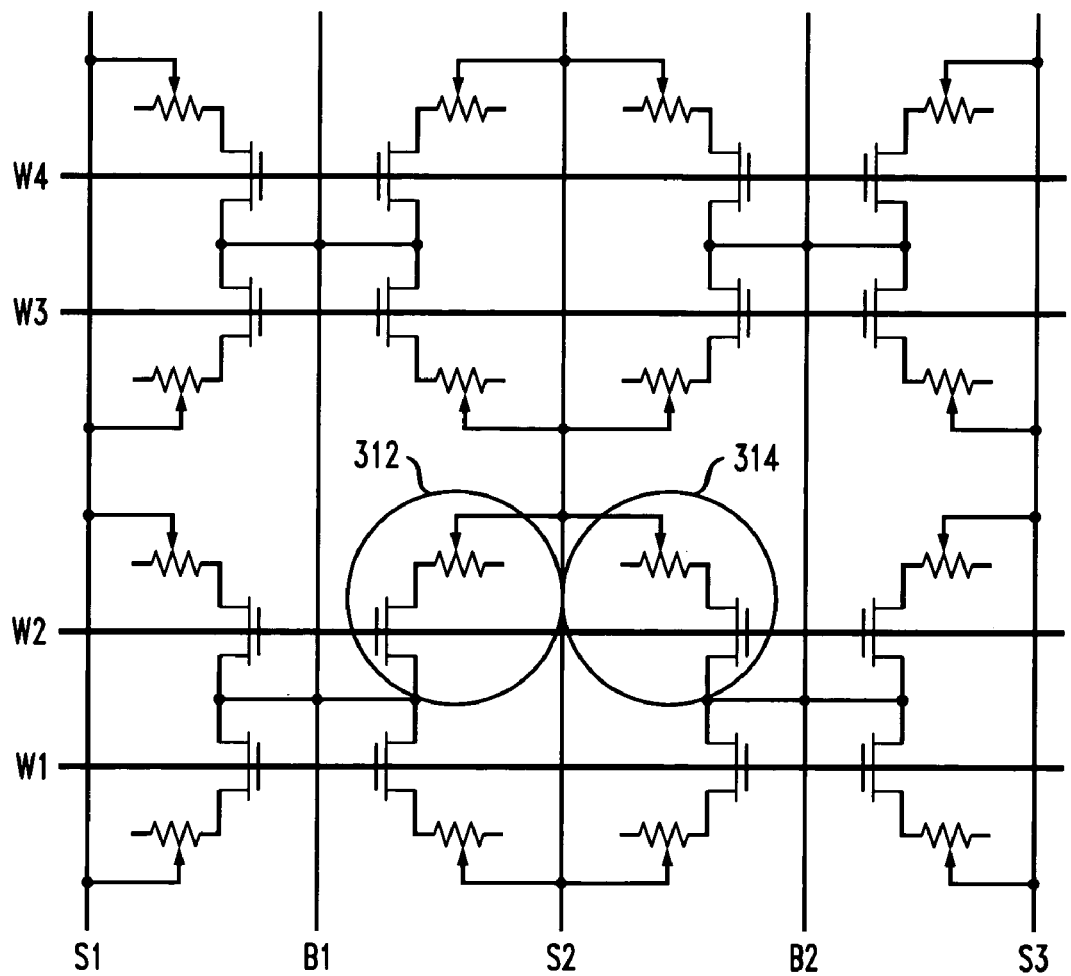
FIG. 4 is a schematic diagram depicting the memory array shown in FIG. 3A with accompanying exemplary bias voltages applied to the word lines, bit lines and source lines for reading a selected one of the memory cells, in accordance with the present invention.

FIG. 4 is a schematic diagram depicting the illustrative memory array 300 shown in FIG. 3A with accompanying exemplary bias voltages applied to the word lines, bit lines and source lines for reading one or more selected memory cells in the memory array, in accordance with one aspect of the invention. By applying a logic high level (e.g., about 1.0V) to a word line (e.g., word line W2), memory cells (e.g., m2,1, m2,2, m2,3 and m2,4,) coupled to the word line can be selected, depending on the bias voltages applied to the bit lines and source lines corresponding to these memory cells. For example, memory cells m2,2 and m2,3 (corresponding to memory cells 312 and 314, respectively) in memory array 300 can be read, either simultaneously or individually, through bit lines B1 and B2, respectively, by concurrently driving shared word line W2 to a logic high state (e.g., 1.0V) and by driving shared source line S2 to a logic low state (e.g., 0V). All other unselected word lines, in this example, word lines W1, W3 and W4, are preferably held at 0V (e.g., ground). Exemplary bias voltages applied to each of the bit lines (e.g., B1 and B2), source lines (e.g., S1 through S3) and word lines (e.g., W1 through W4) depicted in the figure are shown in the accompanying bias table 400.

For reading a selected memory cell 312, a small read voltage, such as about 0.5V or less, is applied to the active bit line B1, and the active source line S2 corresponding to the selected memory cell is held at 0V. Concurrently, the selected word line W2 is biased at about 1V in this example. Likewise, for reading memory cell 314, a small read voltage is applied to active bit line B2, and the active source S2 is held at 0V. As previously stated, memory cells 312 and 314 can be read either individually or simultaneously in this manner. The resistance value, and thus the state of the stored bit, can be determined by sensing the magnitude of the current passing through the bipolar programmable storage element in the memory cell(s) 312 and 314.

Memory cells associated with a word line that is held at 0V (unselected) cannot be read from or written to, since the FET devices in those respective memory cells will be turned off, regardless of the bias voltages applied to the respective bit line/source line pairs corresponding to those unselected memory cells. Similarly, for memory cells sharing a common selected word line, W2 in this example, it is important that the bit line and source line corresponding each memory cell in the memory array for which no read operation is intended are held at substantially the same voltage potential so as to prevent a current from flowing through the bipolar programmable storage element in that memory cell. In the illustrative scenario of FIG. 4, since word line W2 is active, unselected memory cell m2,1 (310 in FIG. 3A) may also be read. Accordingly, source line S1 corresponding to memory cell m2,1 is preferably held at substantially the same voltage potential (e.g., about 0.5V) as bit line B1 also corresponding to memory cell m2, 1.

Figure 5:
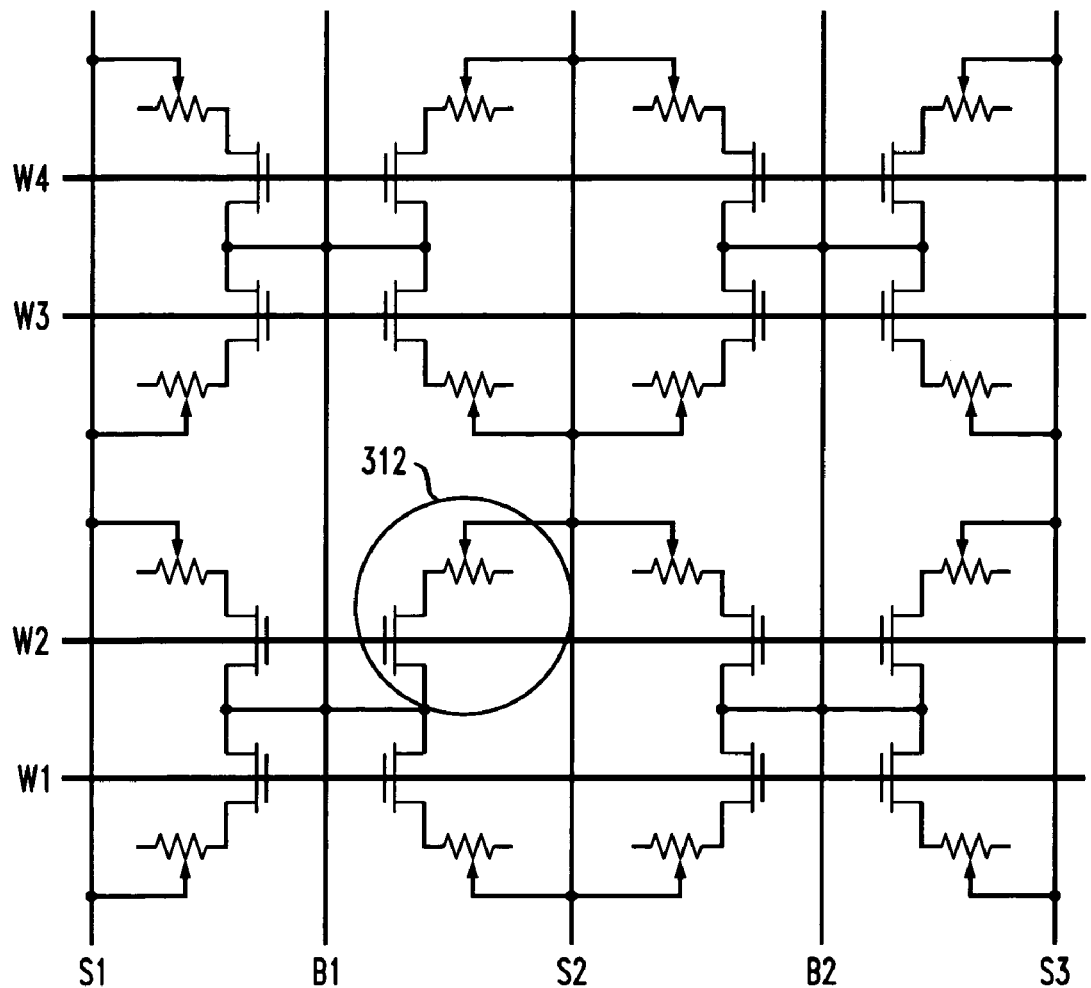
FIG. 5 is a schematic diagram depicting the memory array shown in FIG. 3A with accompanying exemplary bias voltages applied to the word lines, bit lines and source lines for writing a selected one of the memory cells, in accordance with the present invention.

FIG. 5 is a schematic diagram depicting the memory array 300 shown in FIG. 3A with accompanying exemplary bias voltages applied to the word, bit lines and source lines for writing a selected one of the memory cells, in accordance with one aspect of the invention. As apparent from the figure, memory cell m2,2, corresponding to memory cell 312 in memory array 300, is selected to be programmed by activating word line W2. The remaining word lines, W1, W3 and W4, are all held at 0V, thereby turning off the FET devices in the respective memory cells m1,1, m1,2, m1,3, m1,4, m3,1, m3,2, m3,3, m3,4, m4,1, m4,2, m4,3, and m4,4. Depending on the value of the resistance, and thus the state, of the corresponding bipolar programmable storage element to be written, bit line B1 and source line S2 corresponding to memory cell 312 are preferably biased complementary to one another. Exemplary bias voltages applied to each of the bit lines (e.g., B1 and B2), source lines (e.g., S1 through S3) and word lines (e.g., W1 through W4) depicted in the figure are shown in the accompanying bias table 500. In this example, 1.0V and 0V are used to bias the bit line/source line pair associated with the selected memory cell 312, although the invention is not limited to any particular voltage levels. In order to increase the overdrive and thereby provide a higher programming current for a selected memory cell, the activated word line W2 can be biased to a potential greater than the positive supply, such as, for example, about 1.5V for a supply voltage of about 1.0V.

While the above description, with reference to FIGS. 4 and 5, documents an exemplary read and write operation of a selected memory cell(s) in a shared word line memory array architecture 300, multiple-bit applications can be similarly exercised, in accordance with another aspect of the invention, for example, by varying the magnitudes of voltage potentials applied to the bit line, source line and word line associated with a given memory cell during a write operation, and/or by using multiple sensing references during a read operation.

At least a portion of the nonvolatile memory cell and/or memory array of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A nonvolatile memory array, comprising:
a plurality of word lines;
a plurality of bit lines;
a plurality of source lines; and
a plurality of nonvolatile memory cells, each of at least a subset of the plurality of memory cells having a first terminal connected to one of the plurality of word lines, a second terminal connected to one of the plurality of bit lines, and a third terminal connected to one of the plurality of source lines, at least one of the memory cells comprising:
a bipolar programmable storage element operative to store a logic state of the memory cell, a first terminal of the bipolar programmable storage element connecting to a first line of a corresponding bit line/source line pair; and
a metal-oxide-semiconductor device including first and second source/drains and a gate, the first source/drain being connected to a second terminal of the bipolar programmable storage element, the second source/drain connecting to a second line of the corresponding bit line/source line pair, and the gate connecting to a corresponding one of the word lines;
wherein for any subset of at least four memory cells connected to a same bit line, each of the four memory cells being adjacent to one another, at least two adjacent memory cells in the subset share a same word line and at least two adjacent memory cells in the subset share a same source line.

2. The memory array of claim 1, wherein the bit lines are arranged substantially parallel relative to one another.

3. The memory array of claim 1, wherein the word lines are arranged substantially parallel relative to one another.

4. The memory array of claim 1, wherein the plurality of word lines is arranged substantially orthogonal to the plurality of bit lines and the plurality of source lines.

5. The memory array of claim 1, wherein the bipolar programmable storage element comprises a magnetic tunnel junction device.

6. The memory array of claim 1, wherein the bipolar programmable storage element in at least one of the plurality of nonvolatile memory cells comprises a transition metal oxide.

7. The memory array of claim 6, wherein the transition metal oxide is doped at a prescribed doping concentration with at least one of chromium, manganese, and vanadium.

8. The memory array of claim 1, wherein a logic state of the bipolar programmable storage element in a given one of the plurality of nonvolatile memory cells is written by substantially concurrently applying a logic high voltage potential to a corresponding word line connected to the given memory cell, applying a logic high voltage potential to a first line of a corresponding bit line/source line pair, applying a logic low voltage potential to a second line of the corresponding bit line/source line pair, and applying a substantially same voltage potential to a bit line and a source line in each bit line/source line pair corresponding to other memory cells connected to the corresponding word line, a polarity of the voltage potential across the corresponding bit line/source line pair being indicative of the logic state to be written into the memory cell.

9. The memory array of claim 1, wherein a logic state of the bipolar programmable storage element in a given one of the plurality of nonvolatile memory cells is read by applying a logic high voltage potential to a corresponding word line connected to the given memory cell, and substantially concurrently applying a logic low voltage potential to a first line and applying a read voltage potential to and sensing a current on a second and third line, the first line being a of the corresponding bit line/source line pair, a magnitude of the sensed current being indicative of the logic state of the memory cell.

10. The memory array of claim 1, wherein the memory array is configured to enable two adjacent memory cells connected to a same word line to be read substantially simultaneously.

11. The memory array of claim 10, wherein the two adjacent memory cells are substantially simultaneously read by applying a logic high voltage potential to the word line connected to the adjacent memory cells, and substantially concurrently applying a logic low voltage potential to a first line of each bit line/source line pair corresponding to the adjacent memory cells, the first line being shared by the adjacent memory cells, and applying a read voltage potential to each of a second line of the bit line/source line corresponding to the adjacent memory cells.

12. The memory array of claim 1, wherein the bipolar programmable storage element in at least one of the plurality of nonvolatile memory cells comprises at least one of chromium-doped strontium titanium oxide, strontium titanium oxide, strontium barium titanium oxide, praseodymium calcium manganese oxide, strontium zirconium oxide, and nickel oxide.

13. An integrated circuit including at least one nonvolatile memory array, the at least one memory array comprising:
a plurality of word lines;
a plurality of bit lines;
a plurality of source lines; and a plurality of nonvolatile memory cells, each of at least a subset of the plurality of memory cells having a first terminal connected to one of the plurality of word lines, a second terminal connected to one of the plurality of bit lines, and a third terminal connected to one of the plurality of source lines, at least one of the memory cells comprising:

a bipolar programmable storage element operative to store a logic state of the memory cell, a first terminal of the bipolar programmable storage element connecting to a first line of a corresponding bit line/source line pair; and a metal-oxide-semiconductor device including first and second source/drains and a gate, the first source/drain being connected to a second terminal of the bipolar programmable storage element, the second source/drain connecting to a second line of the corresponding bit line/source line pair, and the gate connecting to a corresponding one of the word lines;

wherein for any subset of at least four memory cells connected to a same bit line, each of the four memory cells being adjacent to one another, at least two adjacent memory cells in the subset share a same word line and at least two adjacent memory cells in the subset share a same source line.

14. The integrated circuit of claim 13, wherein a logic state of the bipolar programmable storage element in a given one of the plurality of nonvolatile memory cells is written by substantially concurrently applying a logic high voltage potential to a corresponding word line connected to the given memory cell, applying a logic high voltage potential to a first line of a corresponding bit line/source line pair, applying a logic low voltage potential to a second line of the corresponding bit line/source line pair, and applying a substantially same voltage potential to a bit line and a source line in each bit line/source line pair corresponding to other memory cells connected to the corresponding word line, a polarity of the voltage potential across the corresponding bit line/source line pair being indicative of the logic state to be written into the memory cell.

15. The integrated circuit of claim 13, wherein a logic state of the bipolar programmable storage element in a given one of the plurality of nonvolatile memory cells is read by applying a logic high voltage potential to a corresponding word line connected to the given memory cell, and substantially concurrently applying a logic low voltage potential to a first line and applying a read voltage potential to and sensing a current on a second and third line, the first line being a of the corresponding bit line/source line pair, a magnitude of the sensed current being indicative of the logic state of the memory cell.

16. The integrated circuit of claim 13, wherein the at least one memory array is configured to enable two adjacent memory cells connected to a same word line to be read substantially simultaneously.

17. The integrated circuit of claim 16, wherein the two adjacent memory cells are substantially simultaneously read by applying a logic high voltage potential to the word line connected to the adjacent memory cells, and substantially concurrently applying a logic low voltage potential to a first line of each bit line/source line pair corresponding to the adjacent memory cells, the first line being shared by the adjacent memory cells, and applying a read voltage potential to each of a second line of the bit line/source line corresponding to the adjacent memory cells.

18. The integrated circuit of claim 13, wherein the bipolar programmable storage element in at least one of the plurality of nonvolatile memory cells comprises at least one of chromium-doped strontium titanium oxide, strontium titanium oxide, strontium barium titanium oxide, praseodymium calcium manganese oxide, strontium zirconium oxide, and nickel oxide.

19. The integrated circuit of claim 13, wherein the plurality of word lines is arranged substantially orthogonal to the plurality of bit lines and the plurality of source lines.

20. The integrated circuit of claim 13, wherein the bit lines and source lines are arranged substantially parallel relative to one another.

* * * * *